(12) United States Patent
Lin et al.

(10) Patent No.: US 9,634,147 B2
(45) Date of Patent: Apr. 25, 2017

(54) THIN FILM TRANSISTOR ARRAY SUBSTRATE AND LIQUID CRYSTAL DISPLAY PANEL USING SAME

(71) Applicant: Ye Xin Technology Consulting Co., Ltd., Hsinchu (TW)

(72) Inventors: Hsin-Hua Lin, Hsinchu (TW); Yi-Chun Kao, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/697,154

(22) Filed: Apr. 27, 2015

(65) Prior Publication Data
US 2016/0155856 A1    Jun. 2, 2016

(30) Foreign Application Priority Data
Nov. 27, 2014   (TW) .............................. 103141187 A

(51) Int. Cl.
| | | |
|---|---|---|
| *G02F 1/136* | (2006.01) | |
| *H01L 29/786* | (2006.01) | |
| *G02F 1/1368* | (2006.01) | |
| *G02F 1/1362* | (2006.01) | |
| *G02F 1/1335* | (2006.01) | |
| *H01L 27/12* | (2006.01) | |

(52) U.S. Cl.
CPC ...... *H01L 29/78606* (2013.01); *G02F 1/1368* (2013.01); *G02F 1/133512* (2013.01); *G02F 1/133514* (2013.01); *G02F 1/136227* (2013.01); *G02F 1/136286* (2013.01); *H01L 27/1248* (2013.01)

(58) Field of Classification Search
CPC ......... G02F 1/133514; G02F 1/136227; G02F 1/1368; G02F 1/136286; G02F 1/133512; H01L 21/76829; H01L 27/1248; H01L 29/7869; H01L 29/78606
See application file for complete search history.

(56) References Cited

U.S. PATENT DOCUMENTS

| | | | |
|---|---|---|---|
| 2009/0020838 A1* | 1/2009 | Lin | ............... H01L 27/14621 257/432 |
| 2012/0068202 A1* | 3/2012 | Saito | ............... G02F 1/1368 257/88 |
| 2013/0265516 A1 | 10/2013 | Chen | |
| 2013/0313530 A1* | 11/2013 | Seo | ............... H01L 29/66969 257/40 |

FOREIGN PATENT DOCUMENTS

TW    201327002 A    7/2013

* cited by examiner

*Primary Examiner* — Nathanael R Briggs
(74) *Attorney, Agent, or Firm* — Steven Reiss

(57) ABSTRACT

A thin film transistor (TFT) array substrate of a liquid crystal display (LCD) panel includes a first substrate, a gate located on the first substrate, a gate insulation layer located on the first substrate and covers the gate and the first substrate, a source layer located on the gate insulation layer to correspond to the gate, an etching stopping layer located on the source layer, and a source and a drain located on the etching stopping layer. The etching stopping layer is made of color photoresist.

20 Claims, 7 Drawing Sheets

THIN FILM TRANSISTOR ARRAY SUBSTRATE AND LIQUID CRYSTAL DISPLAY PANEL USING SAME

CROSS-REFERENCE TO RELATED APPLICATIONS

This application claims priority to Taiwanese Patent Application No. 103141187 filed on Nov. 27, 2014 in the Taiwanese Intellectual Property Office, the contents of which are incorporated by reference herein.

FIELD

The present disclosure generally relates to a thin film transistor (TFT) array substrate used in a liquid crystal display (LCD) panel.

BACKGROUND

A liquid crystal display (LCD) panel generally includes a thin film transistor (TFT) array substrate and a color filter substrate. The TFT array substrate and the color filter substrate can be assembled together by adhesive materials.

BRIEF DESCRIPTION OF THE DRAWINGS

Implementations of the present technology will now be described, by way of example only, with reference to the attached figures.

DETAILED DESCRIPTION

Figure 1:
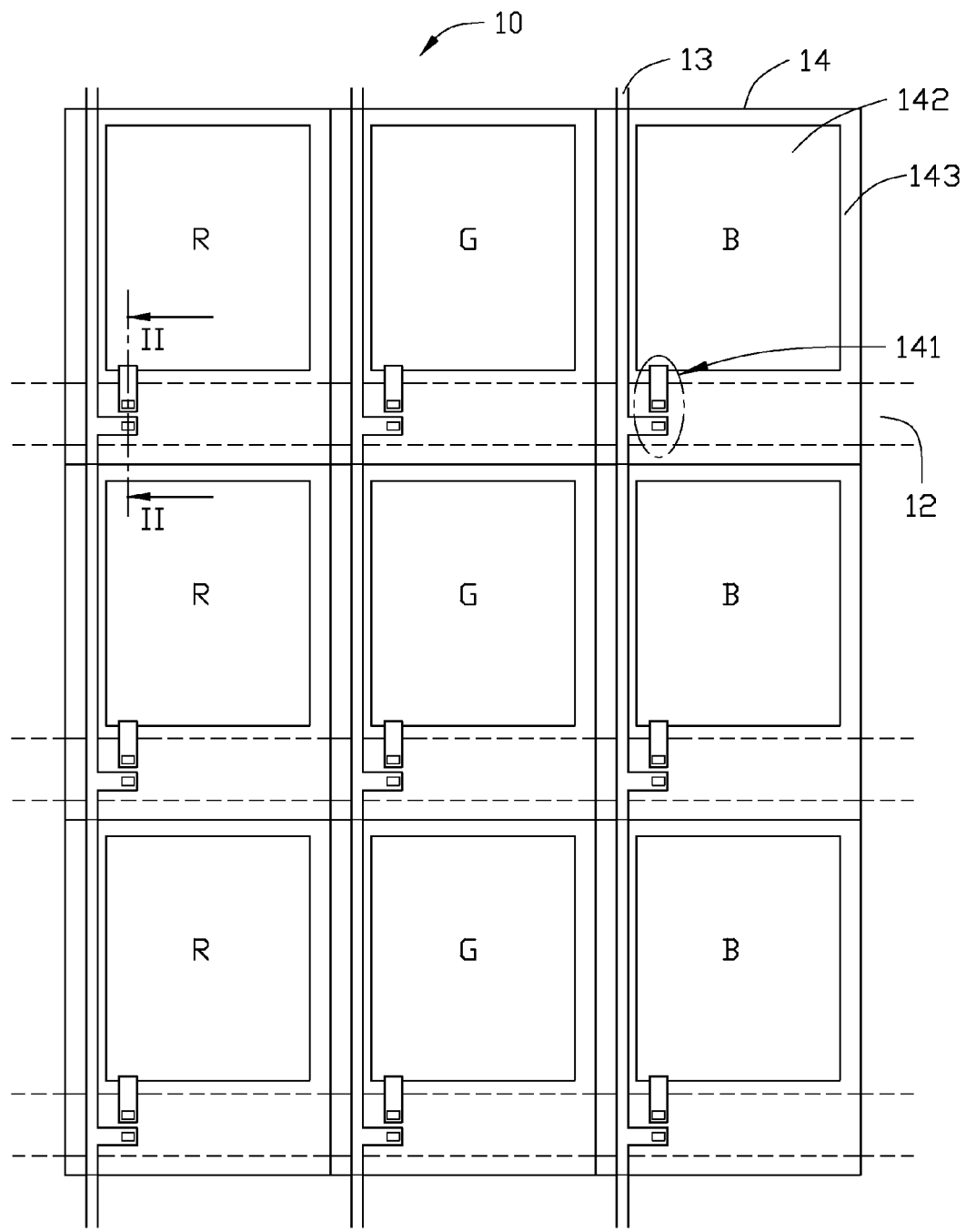
FIG. 1 is a diagrammatic view of a thin film transistor (TFT) array substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

The present disclosure is described in relation to a thin film transistor (TFT) array substrate of a liquid crystal display (LCD) panel.

Figure 2:
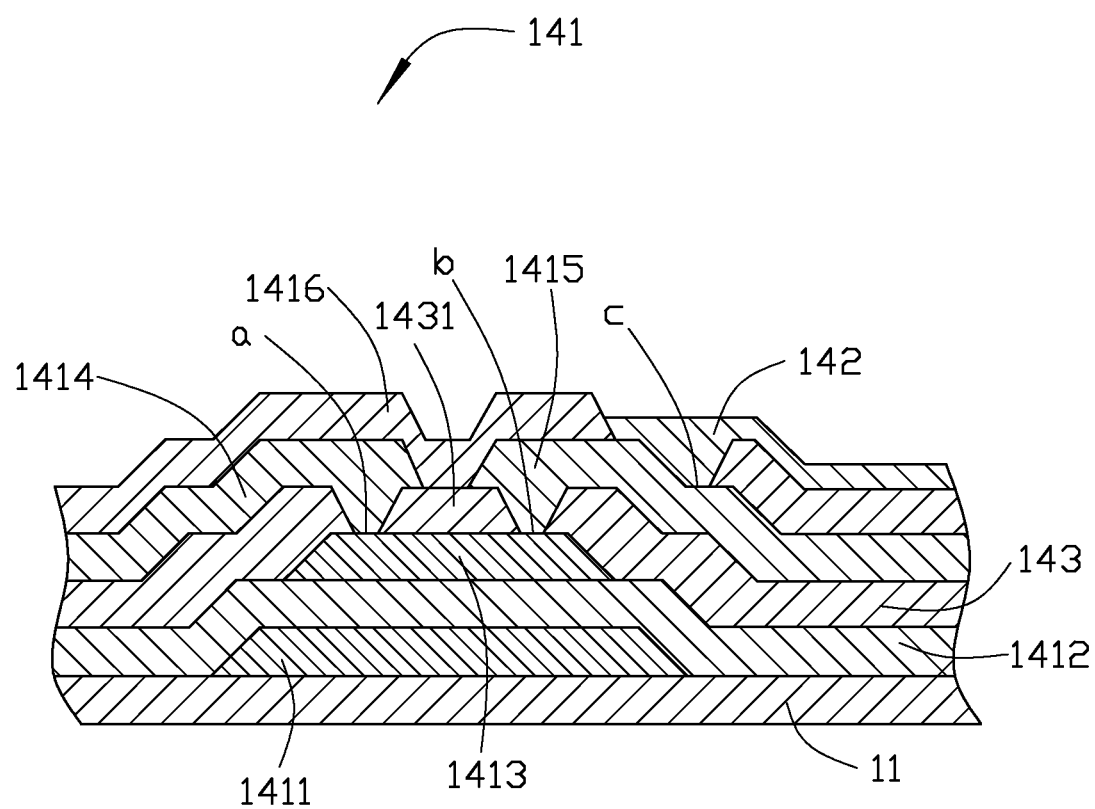
FIG. 2 is a cross-sectional view of the TFT array substrate of FIG. 1 taken along line II-II of FIG. 1.

Referring to FIG. 1 and FIG. 2, FIG. 1 shows a partially diagrammatic view of a thin film transistor (TFT) array substrate 10, FIG. 2 shows a cross-sectional view of the TFT array substrate 10 taken along line II-II of FIG. 1. The TFT array substrate 10 includes a first substrate 11, a plurality of gate lines 12, and a plurality of data lines 13. The gate lines 12 and the data lines 13 are intersected with each other to define a plurality of pixels areas 14. In at least one embodiment, the gate lines 12 are arranged in parallel, and the data lines 13 are arrange in parallel as well as the gate lines 12. The gate lines 12 extend along a first direction while the data lines extend along a second direction perpendicular with the first direction. Thus, the pixel area 14 is rectangular. The first substrate 11 can be made of rigid and transparent inorganic materials, such as glass, quartz, or other like materials. In other embodiments, the first substrate 11 can also be made of flexible organic materials, such as plastics, rubbers, polyesters, or other like materials.

Each pixel area 14 includes a thin film transistor (TFT) 141, a pixel electrode 142, and a color photoresist layer 143. The TFT 141 is located at an intersection of a gate line 12 and a data line 13, and is electrically coupled to the gate line 12 and the data line 13 respectively. The pixel electrode 142 is located within the pixel area 14 and is electrically coupled to the TFT 141.

The TFT 141 includes a gate 1411, a gate insulation layer 1412, a channel layer 1413, the color photoresist layer 143, a source 1414, a drain 1415, and a passivation layer 1416. The channel layer 1413 is located on the gate insulation layer 1412 corresponding to the gate 1411. The color photoresist layer 143 is located on and covers the channel layer 1413. The source 1414 and the drain 1415 are located on the color photoresist layer 143 and are respectively coupled to the channel layer 1413. The passivation layer 1416 is locate on the source 1414 and the drain 1415, and covers the source 1414 and the drain 1415. The gate line 12 is electrically coupled to the gate 1411, and the data line 13 is electrically coupled to the source 1414.

In addition, the TFT 141 can further include an etching stopping layer (ESL) 1431 located on the channel layer 1413. The etching stopping layer 1431 is made of color photoresist as well as the color photoresist layer 143. In this embodiment, a portion of the color photoresist layer 143 serves as the etching stopping layer 1431. In other words, the etching stopping layer 1431 is a portion of the color photoresist layer 143. The color photoresist layer 143 includes a plurality of photoresist units, such as red photoresist units R, green photoresist units G, and blue photoresist units B. The photoresist units can be arranged in a matrix having a plurality of rows and columns. The photoresist units which are arranged in a same row of the matrix may have different colors. For example, the photoresist units arranged in a row of the matrix can comprise a red photoresist unit R, a green photoresist unit G, and a blue photoresist unit B. The photoresist units which are arranged in a same column of the matrix may have a same color. For example, the photoresist units arranged in a column of the matrix can comprise three red photoresist units R, or three green photoresist units G, or three blue photoresist units B. Thus, for each pixel area 14, the photoresist units arranged in a same column can be manufactured in a same process.

In at least one embodiment, the gate 1411 can be made of conductive materials which are coated on the substrate 114 such as by a physical vapor deposition (PVD) method or by a sputtering method. Then, the conductive materials coated on the substrate 114 can be patterned by a photo etching process (PEP) to form the gate 1411. After the gate insulation layer 1412 is coated on the first substrate 11 to cover the gate 1411 and the first substrate 11, the channel layer 1413 can be formed on the gate insulation layer 1412 using the same manufacturing method of the gate 1411. The channel layer 1413 can be made of metal oxides materials such as IGZO, IZO, or IAZO. the source 1414 and the drain 1415 can be made of the same conductive materials such as copper (Cu) in a same manufacturing process. The gate line 12 and the gate 1411 can be manufactured in a same manufacturing process. The source 1414, the drain 1415, and the data line 13 can be formed in a same manufacturing process.

The color photoresist layer 143 can include a first through hole a and a second through hole b. The source 1414 and the drain 1415 are electrically coupled to the channel layer 1413 via the first through hole a and the first through hole b, respectively. The passivation layer 1416 includes a third through hole c located on the drain 1415. The pixel electrode 142 is located on the passivation layer 1416 and is electrically coupled to the drain 1415 via the third through hole c. In at least one embodiment, the pixel electrode 142 can be made of transparent materials, such as indium tin oxide (ITO). A portion of the color photoresist layer 143 between the first through hole a and the second through hole b serves as the etching stopping layer 1431.

As described above, the TFT array substrate 10 uses a portion of the color photoresist layer 143 to serve as the etching stopping layer 1431. An extra process for manufacturing the etching stopping layer 1431 can be omitted. Thus, the manufacturing cost of the TFT array substrate 10 can be reduced.

Figure 3:
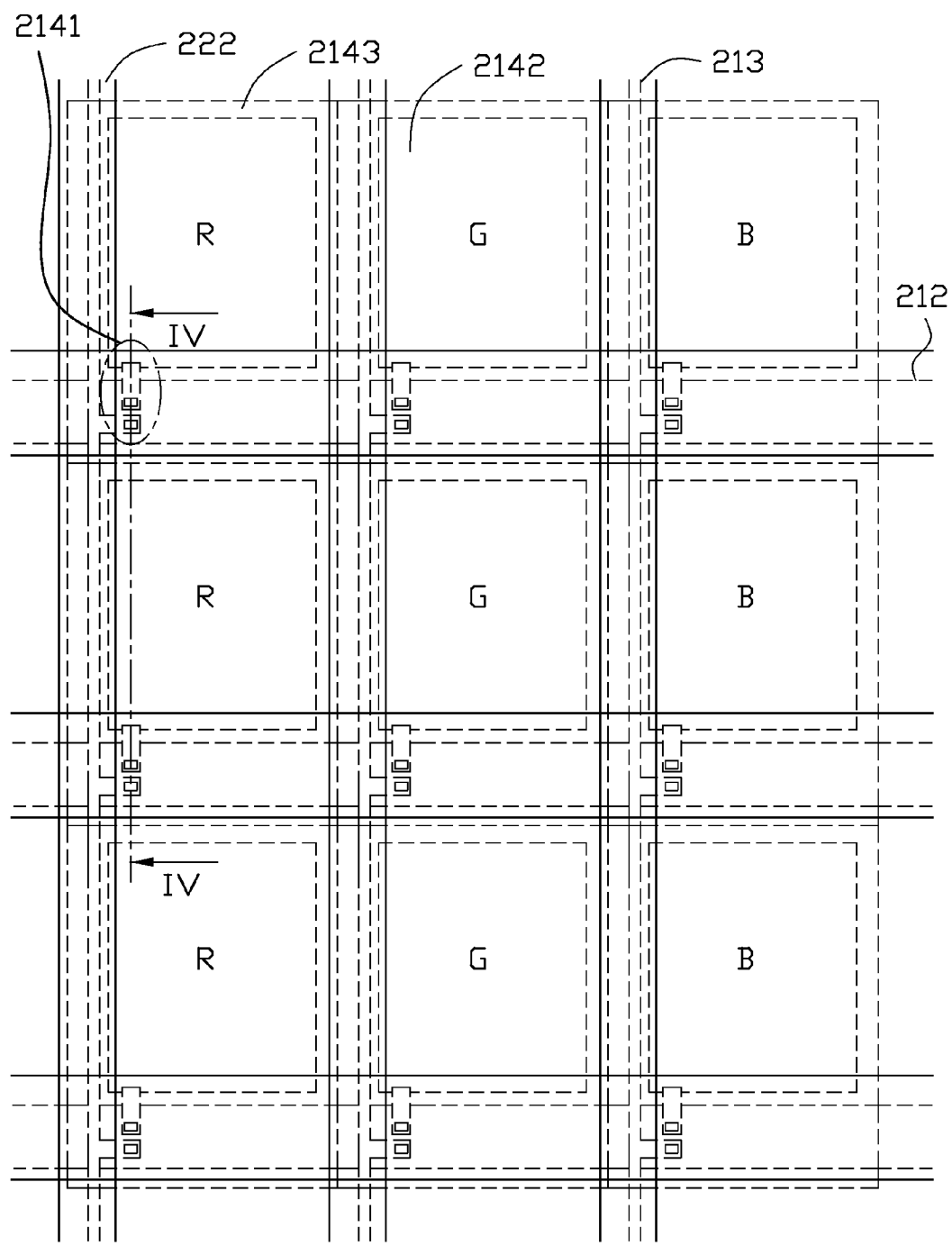
FIG. 3 is a diagrammatic view of a liquid crystal display (LCD) panel according to a first embodiment of the present disclosure.
Figure 4:
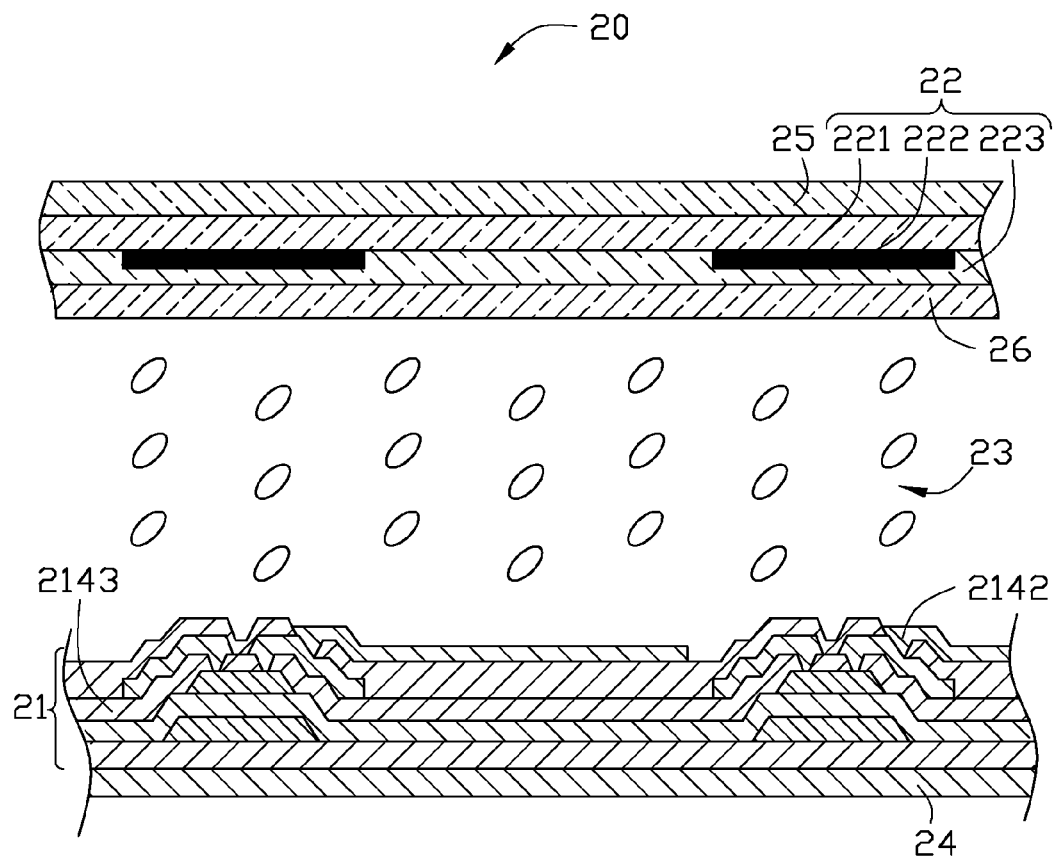
FIG. 4 is a cross-sectional view of the LCD panel of FIG. 3 taken along line IV-IV of FIG. 3.

Referring to FIG. 3 and FIG. 4, FIG. 3 is a diagrammatic view of a liquid crystal display (LCD) panel 20 according to a first embodiment of the present disclosure, FIG. 4 is a cross-sectional view of the LCD panel 20 of FIG. 3 taken along line IV-IV. The LCD panel 20 can include a TFT array substrate 21, an opposite substrate 22, and a liquid crystal layer 23 sandwiched between the TFT array substrate 21 and the opposite substrate 22. In at least one embodiment, the structure of the TFT array substrate 21 is the same to that of the TFT array substrate 10 of FIG. 1, detailed descriptions thereof are omitted here.

The opposite substrate 22 includes a second substrate 221, and a black matrix 222 and a flat layer 223 located on the second substrate 221. The flat layer 223 is located between the second substrate 221 and a common electrode layer 26. The black matrix 222 is located between the second substrate 221 and the flat layer 223. The black matrix 222 is grid patterned to shield gate lines 212, data lines 213, and TFTs 2141 of the TFT array substrate 21. In at least one embodiment, the black matrixes and a color photoresist layer 2143 corporately form a color filter of the LCD panel 20. The color photoresist layer 2143 is the same to the color photoresist layer 143 of FIG. 2, detailed descriptions thereof are omitted. The black matrix 222 is located between two adjacent photoresist units of the color photoresist layer 2143. The second substrate 221 can be made of transparent materials, such as glass, quartz, or other like materials. In other embodiments, the second substrate 221 can be made of non-transparent and rigid inorganic materials, such as plastics, rubber, polyester, polycarbonate, or other like materials.

The LCD panel 20 can further include a first polarizer 24 and a second polarizer 25. The first polarizer 24 is located at a side of the TFT array substrate 21 away from the liquid crystal layer 23. The second polarizer 25 is located at a side of the opposite substrate 22 away from the liquid crystal layer 23. The common electrode layer 26 is located at another side of the opposite substrate 22 adjacent to the liquid crystal layer 23. The common electrode layer 26 is configured to work with a pixel electrode 2142 of the TFT array substrate 21 to produce an electrical field for driving liquid crystals of the liquid crystal layer 23 to rotate. In at least one embodiment, the common electrode 26 can be made of the same materials with the pixel electrode 2142. For example, the materials can be transparent materials such as ITO.

Figure 5:
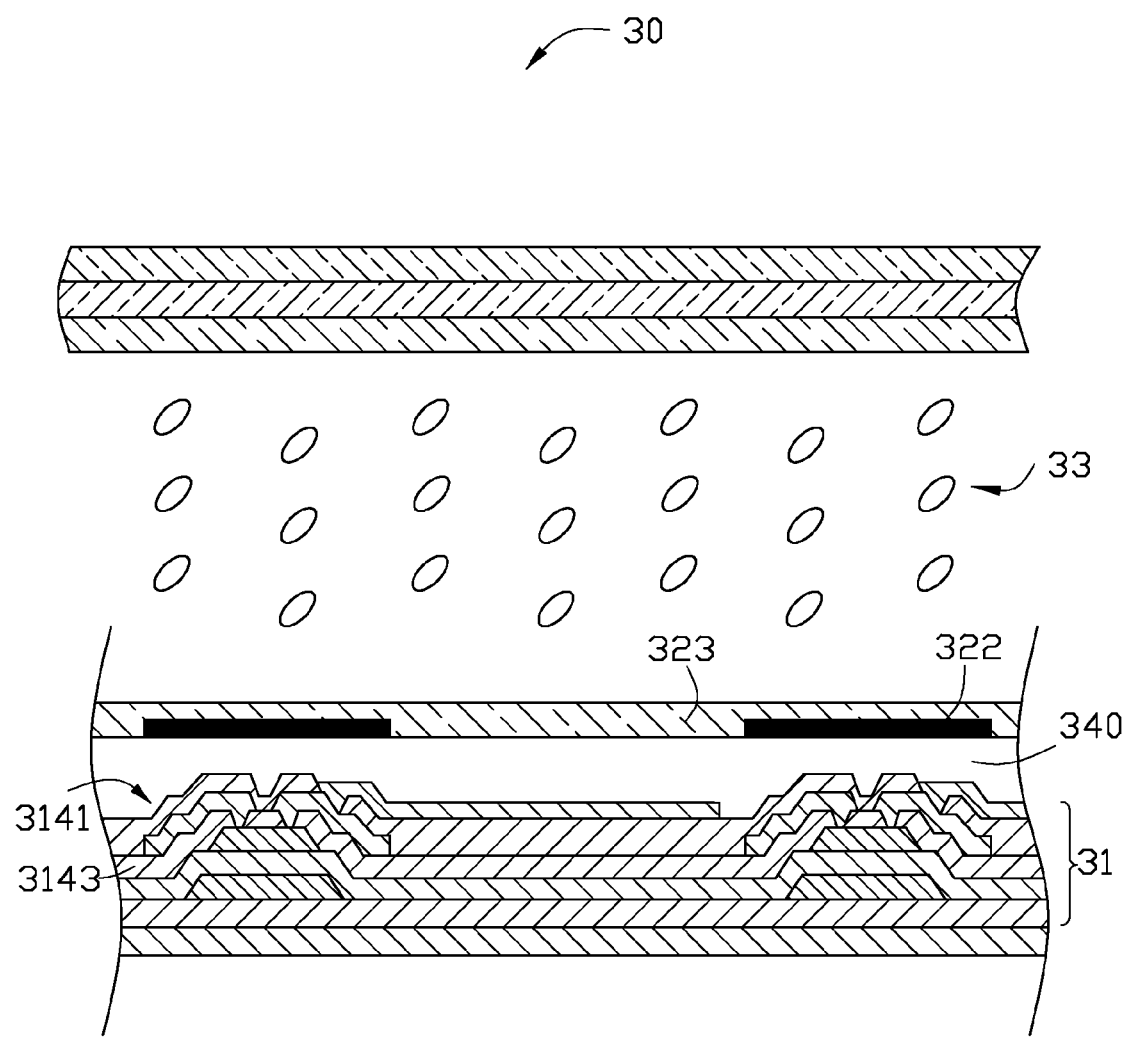
FIG. 5 is a cross-sectional view of the LCD panel according to a second embodiment.

Referring to FIG. 5, FIG. 5 is a cross-sectional view of an LCD panel 30 according to a second embodiment. In the second embodiment, the LCD panel 30 is similar to the LCD panel 2 in the first embodiment, except that a black matrix 322 and a flat layer 323 are located on a TFT array substrate 31 of the LCD panel 30. The flat layer 323 is located at a side of the TFT array substrate 31 adjacent to a liquid crystal layer 33, while the black matrix 322 is located between the flat layer 323 and the TFT array substrate 31. The black matrix 322 and a color photoresist layer 3143 of the TFT array substrate 31 consist of a color filter of the LCD panel 30. In addition, the TFT array substrate 31 further includes another flat layer 340 located between the black matrix 322 and a TFT 3141 of the TFT array substrate 31, to allow the black matrix 322 to be formed thereon.

Figure 6:
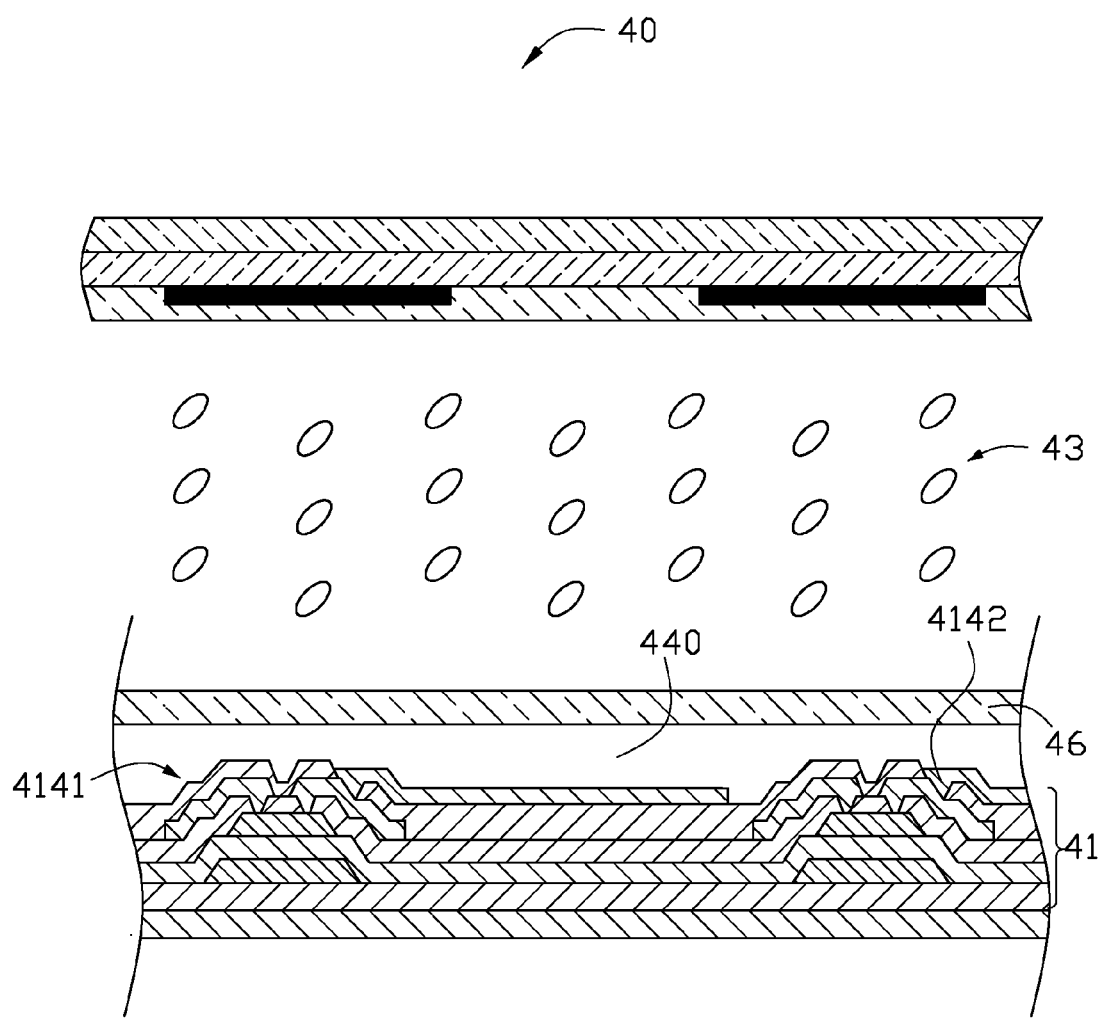
FIG. 6 is a cross-sectional view of the LCD panel according to a third embodiment.

Referring to FIG. 6, FIG. 6 is a cross-sectional view of an LCD panel 40 according to a third embodiment. In the third embodiment, the LCD panel 40 is similar to the LCD panel 20 in the first embodiment, except that a common electrode layer 46 of the LCD panel 40 is located on a TFT array substrate 41 and is adjacent to a liquid crystal layer 43 of the LCD panel 40. Further, a flat layer 440 is located between the common electrode layer 46 and a TFT 4141 of the TFT array substrate 41, to make the common electrode layer 46 and a pixel electrode 4142 of the TFT array substrate 41 isolate from each other.

Figure 7:
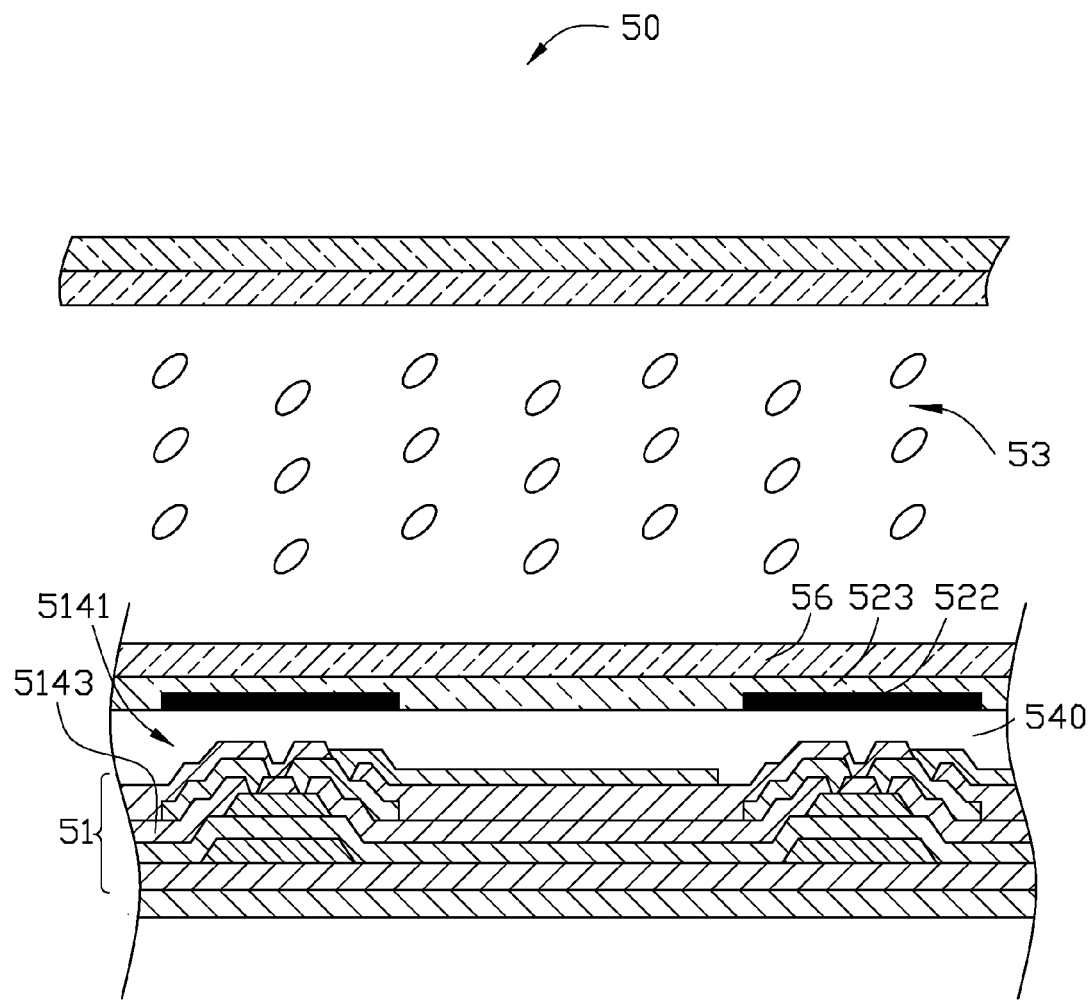
FIG. 7 is a cross-sectional view of the LCD panel according to a fourth embodiment.

Referring to FIG. 7, FIG. 7 is a cross-sectional view of an LCD panel 50 according to a fourth embodiment. In the fourth embodiment, the LCD panel 50 is similar to the LCD panel 20 in the first embodiment, except that a common electrode layer 50, a black matrix 522, and a flat layer 523 of the LCD panel 50 are located on a TFT array substrate 51. The common electrode layer 56 is located at a side of the TFT array substrate 51 adjacent to a liquid crystal 53 of the LCD panel 50. The flat layer 523 is located between the TFT array substrate 51 and the common electrode layer 56. The black matrix 522 is located between the flat layer 523 and the TFT array substrate 51. The flat layer 523 covers the TFT array substrate 51 and the black matrix 522. The black matrix 522 and a color photoresist layer 5143 of the TFT array substrate 51 consist of a color filter of the LCD panel 50. In addition, the TFT array substrate 51 further includes another flat layer 540 located between the black matrix 522 and a TFT 5141 of the TFT array substrate 51, to allow the black matrix 522 be formed thereon.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A thin film transistor (TFT) array substrate comprising:
a first substrate;
a gate located on the first substrate;
a gate insulation layer located on the first substrate and covering the gate and the first substrate;
a channel layer located on the gate insulation layer and corresponding with the gate;
an etching stopping layer located on the channel layer and composed, at least in part, of color-photo-resistive material;
a source and a drain located on the etching stopping layer, the etching stopping layer being positioned between the source and the channel layer; and
a passivation layer covering the source and the drain.

2. The TFT array substrate according to claim 1, further comprising a color photoresist layer located on the gate insulation layer, the color photoresist layer and the etching stopping layer being located at a same structure layer.

3. The TFT array substrate according to claim 2, wherein a portion of the color photoresist layer positioned on the channel layer defines the etching stopping layer to protect the channel layer; the color photoresist layer is made of a color-photo-resistive material.

4. The TFT array substrate according to claim 2, wherein the color photoresist layer comprises a plurality of color photoresist units composed of at least one red photoresist unit, at least one green photoresist unit, and at least one blue photoresist unit.

5. The TFT array substrate according to claim 4, wherein the plurality of color photoresist units is arranged in a matrix having a plurality of rows and columns.

6. The TFT array substrate according to claim 2, wherein the color photoresist layer comprises a first through hole and a second through hole, the source and the drain are electrically coupled to the channel layer via the first through hole and the second through hole, respectively.

7. The TFT array substrate according to claim 6, wherein the etching stopping layer is located between the first through hole and the second through hole.

8. A liquid crystal display (LCD) panel, comprising a thin film transistor (TFT) array substrate, an opposite substrate opposite to the TFT array substrate, and a liquid crystal layer located between the TFT array substrate and the opposite substrate, the TFT array substrate comprising:
a first substrate;
a gate located on the first substrate;
a gate insulation layer located on the first substrate and covering the gate and the first substrate;
a channel layer located on the gate insulation layer and corresponding with the gate;
an etching stopping layer located on the channel layer and composed, at least in part, of color-photo-resistive material;
a source and a drain located on the etching stopping layer, the etching stopping layer being positioned between the source and the channel layer and being configured to protect the channel layer; and
a passivation layer covering the source and the drain.

9. The LCD panel according to claim 8, wherein the TFT array substrate further comprises a color photoresist layer located on the gate insulation layer, the color photoresist layer and the etching stopping layer are located at a same structure layer.

10. The LCD panel according to claim 9, wherein a portion of the color photoresist layer positioned on the channel layer defines the etching stopping layer to protect the channel layer; the color photoresist layer is made of a color-photo-resistive material.

11. The LCD panel according to claim 9, wherein the color photoresist layer comprises a plurality of color photoresist units composed of at least one red photoresist unit, at least one green photoresist unit, and at least one blue photoresist unit.

12. The LCD panel according to claim 11, wherein the plurality of color photoresist units is arranged in a matrix having a plurality of rows and columns.

13. The LCD panel according to claim 11, further comprising a black matrix located at a side of the opposite substrate adjacent to the liquid crystal layer, and the black matrix is located between each two adjacent color photoresist units.

14. The LCD panel according to claim 13, further comprising a color filter composed of the black matrix and the color photoresist layer.

15. The LCD panel according to claim 9, wherein the color photoresist layer comprises a first through hole and a second through hole, the source and the drain are electrically coupled to the channel layer via the first through hole and the second through hole, respectively.

16. The LCD panel according to claim 15, wherein the etching stopping layer is located between the first through hole and the second through hole.

17. A thin film transistor (TFT) array substrate comprising:
a first substrate; and
a plurality of gate lines and a plurality of data lines formed on the first substrate, the plurality of gate lines and the plurality of data lines insulated from each other and intersecting with each other to define a plurality of pixel areas, each pixel area comprising a TFT, a pixel electrode, and a color photoresist layer, the TFT electrically coupled to a corresponding data line, a corresponding gate line, and a pixel electrode;
the TFT comprising:
a gate located on the first substrate;
a gate insulation layer located on the first substrate and covering the gate and the first substrate;
a channel layer located on the gate insulation layer and corresponding with the gate;
the color photoresist layer being located on the gate insulation layer and covering the channel layer and the gate insulation layer; and
a source and a drain located on the color photoresist layer, wherein the TFT comprises an etching stopping layer which is a portion of the color photo resist layer, the etching stopping layer is positioned between the source and the channel layer and is configured to protect the channel layer.

18. The TFT array substrate according to claim 17, wherein the color photoresist layer comprises a plurality of photoresist units composed of at least one red photoresist unit, at least one green photoresist unit, and at least one blue photoresist unit.

19. The TFT array substrate according to claim 18, wherein the plurality of photoresist units is arranged in a matrix having a plurality of rows and columns.

20. The TFT array substrate according to claim 19, wherein the photoresist units arranged in a same column of the matrix have a same color and are manufactured in a same manufacturing process.

* * * * *